United States Patent [19]
Kusaka et al.

[11] Patent Number: 5,600,180
[45] Date of Patent: Feb. 4, 1997

[54] SEALING STRUCTURE FOR BUMPS ON A SEMICONDUCTOR INTEGRATED CIRCUIT CHIP

[75] Inventors: Teruo Kusaka; Naoji Senba; Atsushi Nishizawa; Nobuaki Takahashi, all of Tokyo, Japan

[73] Assignee: NEC Corporation, Tokyo, Japan

[21] Appl. No.: 505,152

[22] Filed: Jul. 21, 1995

[30] Foreign Application Priority Data

Jul. 22, 1994 [JP] Japan ..................................... 6-170612

[51] Int. Cl.⁶ .................................................. H01L 23/48
[52] U.S. Cl. .......................... 257/692; 257/698; 257/778; 257/737; 257/780; 257/785
[58] Field of Search ..................................... 257/778, 779, 257/698, 780, 692, 785, 737

[56] References Cited

U.S. PATENT DOCUMENTS

| | | | |
|---|---|---|---|
| 5,283,468 | 2/1994 | Kondo et al. | 257/698 |
| 5,461,197 | 10/1995 | Hiruta et al. | 257/778 |

FOREIGN PATENT DOCUMENTS

| | | | |
|---|---|---|---|
| 186818 | 7/1986 | European Pat. Off. | 257/778 |
| 2-142134 | 5/1990 | Japan | 257/778 |
| 9424704 | 10/1994 | WIPO | 257/778 |

Primary Examiner—Sara W. Crane
Assistant Examiner—Roy Potter
Attorney, Agent, or Firm—Young & Thompson

[57] ABSTRACT

A sealing structure for bumps on a semiconductor integrated circuit chip to be bonded through the bumps onto a circuit board is provided wherein a plurality of pads are formed on the semiconductor integrated circuit chip. Each of the pads is formed with a bump thereon. A coating material is provided to coat at least surfaces of the above a plurality of bumps. The material is made of an insulation material having a hardness sufficiently small for showing, when bonding the chip onto the circuit board, a deformation thereby at least a top portion of each of the bumps is made contact with pads provided on the circuit board.

30 Claims, 13 Drawing Sheets

SEALING STRUCTURE FOR BUMPS ON A SEMICONDUCTOR INTEGRATED CIRCUIT CHIP

BACKGROUND OF THE INVENTION

The present invention relates to a semiconductor integrated circuit chip to be bonded through bumps onto a circuit board, and more particularly to a sealing structure for bumps formed on a semiconductor integrated circuit chip to be bonded through the bumps onto a circuit board.

Figure 1:
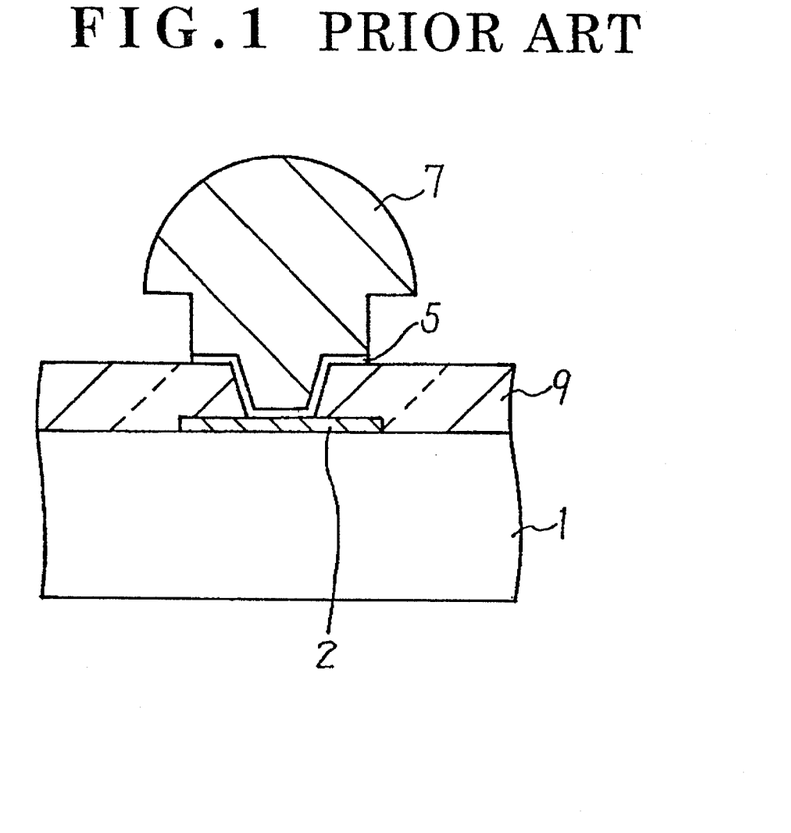
FIG. 1 is a fragmentary cross sectional elevation view illustrative of the sealing structure for bumps on a semiconductor integrated circuit chip to be bonded through the bumps onto a circuit board.
Figure 2:
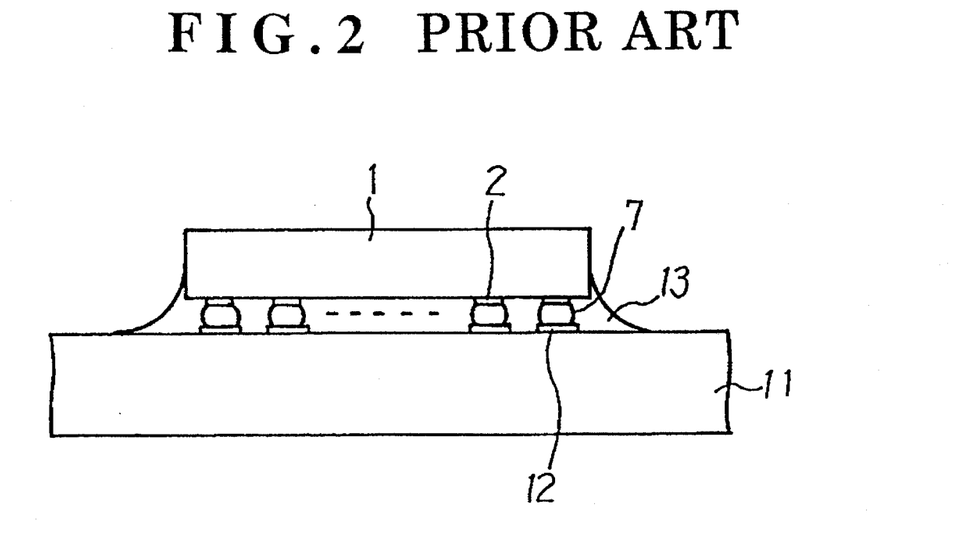
FIG. 2 is a fragmentary cross sectional elevation view illustrative of the conventional semiconductor integrated circuit chip bonded through bumps onto a circuit board.

A conventional structure of a semiconductor integrated circuit chip 1 to be bonded through bumps 7 onto a circuit board 11 is as illustrated in FIG. 1. The chip 1 is formed thereon with a plurality of pads 2. An insulation film 9 is formed on an entire surface of the chip 1 and has a plurality of openings. Each of the openings is positioned just over each of the pads 2 to allow at least a part of each pad 2 to be exposed through each of the openings. A plurality of metal films 5 are formed, each of which is selectively formed on an exposed part of the each pad 2 and on a side wall of the each opening as well as on a top surface of the insulating film 9 but only in the vicinity of the each opening. A plurality of bumps 7 are formed just on the metal films 5 so as to be electrically connected through the metal films 5 to the pads 2. At this stage, each the bump 7 is exposed to an atmosphere including free particles of dusts. In the next step, as illustrated in FIG. 2, a top portion of each of the bumps 7 is jointed by reflow with each of a plurality of pads 12 provided on a circuit board 11 onto which the chip will be bonded. As illustrated in FIG. 2, the circuit board 11 is spaced through the bumps 7 from the chip 1. Namely, there is a space between the chip 1 and the circuit board 11, for which reason the space is sealed with an epoxy resin film 13.

The above conventional semiconductor integrated circuit chip is, however, engaged with the following problem. The surfaces of the bumps 7 are unavoidably exposed to the atmosphere including free particles of dusts until the space between the chip 1 and the circuit board 11 thereby the surfaces thereof tend to be contaminated or oxidized by the atmosphere. This may raise a serious issue of the difficulty in ensuring that the bumps 7 provide electrical contacts between the pads on the chip 1 and on the circuit board 11. Such difficulty may reduce a yield in manufacturing of the products and a reliability of the products.

SUMMARY OF THE INVENTION

Accordingly, it is an object of the present invention to provide a novel sealing structure for bumps on a semiconductor integrated circuit chip to be bonded through the bumps onto a circuit board free from any problems as described above.

It is a further object of the present invention to provide a novel sealing structure for bumps on a semiconductor integrated circuit chip to be bonded through the bumps onto a circuit board to keep the bumps free from contamination and oxidation by an atmosphere.

The above and other objects, features and advantages of the present invention will be apparent from the following descriptions.

The invention provides a novel sealing structure for bumps on a semiconductor integrated circuit chip to be bonded through the bumps onto a circuit board. A plurality of pads are formed on the semiconductor integrated circuit chip. Each of the pads is formed with a bump thereon. A coating material is provided to coat at least surfaces of the a plurality of bumps. The material is made of an insulation material having a hardness sufficiently small for showing, when bonding the chip onto the circuit board, a deformation thereby at least a top portion of each of the bumps is made contact with pads provided on the circuit board.

The invention also provides a novel sealing structure for bumps on a semiconductor integrated circuit chip to be bonded through the bumps onto a circuit board. A plurality of pads are formed on the semiconductor integrated circuit chip. An anisotropic conductive film is provided on the a plurality of pads so that the pads are made contact through the anisotropic conductive film to pads of the circuit board. The anisotropic conductive film allows a current in a direction vertical to a surface of the anisotropic conductive film but prevents any current along the surface of the anisotropic conductive film. Therefore, the each bump is electrically conductive through the anisotropic conductive film to the corresponding pad on the circuit board. There is, however, no conductivity among the pads as well as among the pads on the circuit board.

The invention also provides a novel sealing structure for bumps on a semiconductor integrated circuit chip to be bonded through the bumps onto a circuit board. A plurality of pads are formed on the semiconductor integrated circuit chip. A layer is made of an organic insulation material and is formed on an entire surface of the chip. The organic insulation layer has a plurality of openings. Each of the openings is positioned just over each of the pads to allow at least a part of the each pad to be exposed through each of the openings. A plurality of metal films are formed, each of which is selectively formed on an exposed part of the surface of the each pad and on a side wall of the each opening as well as on a top surface of the organic insulation film in the vicinity of the each opening. A plurality of bumps are formed just on the metal films so as to be electrically connected through the metal films to the pads. A coating material is provided to coat at least surfaces of the a plurality of bumps. The material is made of an insulation material having a hardness sufficiently small for showing, when bonding the chip onto the circuit board, a deformation thereby at least a top portion of each of the bumps is made contact with pads provided on the circuit board.

The invention also provides a novel sealing structure for bumps on a semiconductor integrated circuit chip to be bonded through the bumps onto a circuit board. A plurality of pads are formed on the semiconductor integrated circuit chip. A layer is made of an organic insulation material and is formed on an entire surface of the chip. The organic insulation layer has a plurality of openings. Each of the openings is positioned just over each of the pads to allow at least a part of the each pad to be exposed through each of the openings. A plurality of metal films are formed, each of which is selectively formed on an exposed part of the surface of the each pad and on a side wall of the each opening as well as on a top surface of the organic insulation film in the vicinity of the each opening. A plurality of bumps are formed just on the metal films so as to be electrically connected through the metal films to the pad. Each of the bump has a flat top. An insulation film is formed on a top of the organic insulation film and on a side wall of the bump wherein the insulation film has a thickness so adjusted that a top of the insulation film has the same level as a top of the bump. An anisotropic conductive film is provided on the above flat tops of the bumps and on the top of the insulation film so that the bumps are made contact through the anisotropic conductive film to pads of the circuit board. The anisotropic conductive film allows a current in a direction vertical to a surface of the anisotropic conductive film but prevents any current along the surface of the anisotropic conductive film. Therefore, the each bump is electrically conductive through the anisotropic conductive film to the corresponding pad on the circuit board. There is, however, no conductivity among the bumps as well as among the pads on the circuit board.

The above coating material may comprise a gelatinous material having a coefficient of viscosity in the range from 1000 cP to 2000 cP.

The above gelatinous material may comprise a film within which a plurality of bumps are embedded. The film is formed on an entire surface of said chip.

BRIEF DESCRIPTIONS OF THE DRAWINGS

Preferred embodiments of the present invention will hereinafter fully be described in detail with reference to the accompanying drawings.

PREFERRED EMBODIMENTS OF THE INVENTION

A first embodiment according to the present invention will be described with reference to FIGS. 3A, 3B, 4 and 5 in which a novel sealing structure for bumps on pads formed on a semiconductor integrated circuit chip to be subsequently bonded through the bumps onto a circuit board.

Figure 3A:
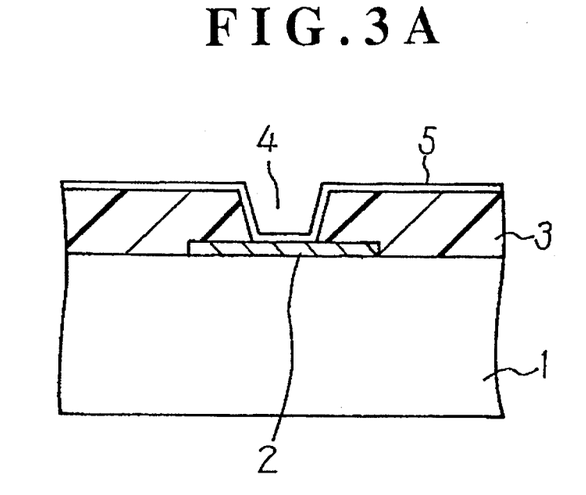
FIGS. 3A and 3B are fragmentary cross sectional elevation views illustrative of sequential processes for forming bumps on a semiconductor integrated circuit chip in first to fourth embodiments according to the present invention.
Figure 3B:
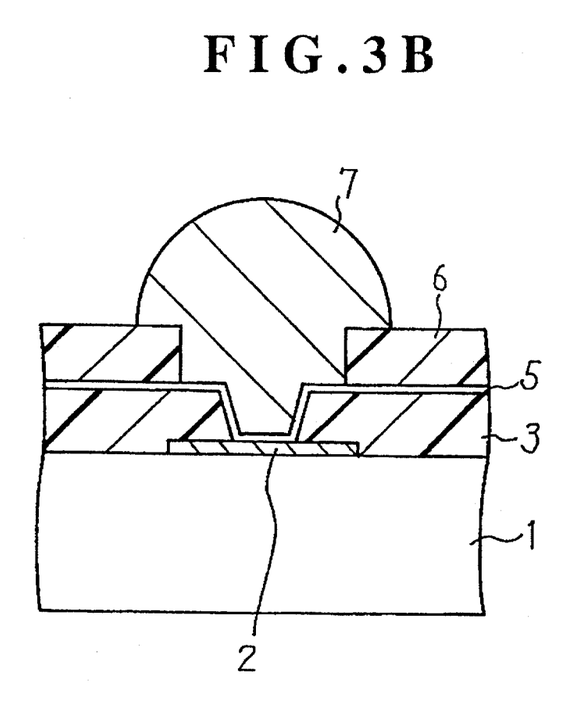

An initial description of the first embodiment will be directed to a process for forming bumps on pads formed on a semiconductor integrated circuit chip 1 with reference to FIGS. 3A and 3B. A plurality of pads 2 made of such as aluminum films are formed on a chip 1 at an interval of about 150 μm, with about 100 μm$^2$ in area. An organic insulation film 3 made of an organic insulation material such as a polyimide, with a thickness of about a few μm is formed on an entire surface of the chip 1 to cover the pads 2. The organic insulation film 3 is selectively removed by etching to form a plurality of openings 4 with a size in the range of 30~80 μm$^2$. Each of the openings 4 is positioned just over each correspondent of the pads 2 to allow at least a part of each pad 2 to be exposed through the each opening 4. A Cr/Cu laminated metal film 5 with a thickness of 0.1~2.0 μm is formed on an exposed part of the surface of the each pad 2 and on a side wall of the each opening 4 as well as on a top of the organic insulation film 3.

In the next step, as illustrated in FIG. 3B, a photoresist film 6 having a thickness of 2~15 μm is deposited on the metal film 5. The deposited photoresist film 6 is patterned by means of a lithography technique to form windows positioned just over the openings 4 wherein the windows have a larger size than that of the openings 4 so that the metal film 5 in the opening 4 and in the vicinity thereof is exposed through the each window of the photoresist film 6. A Pb-Sn solder film is selectively plated just on the exposed part, through the window, of the metal films 5 by use of electroplating to form a bump 7 that has a mushroom-like shape and has a thickness or a height of about 20 μm. The bump 7 is electrically connected through the metal film 5 to the pad 2. It is available that the photoresist film 6 is so deposited to have a larger thickness than a height of the bump 7 so that the bump 7 is defined within the window of the photoresist film 6 to thereby form a column-shaped bump so called straight-shape.

Figure 4:
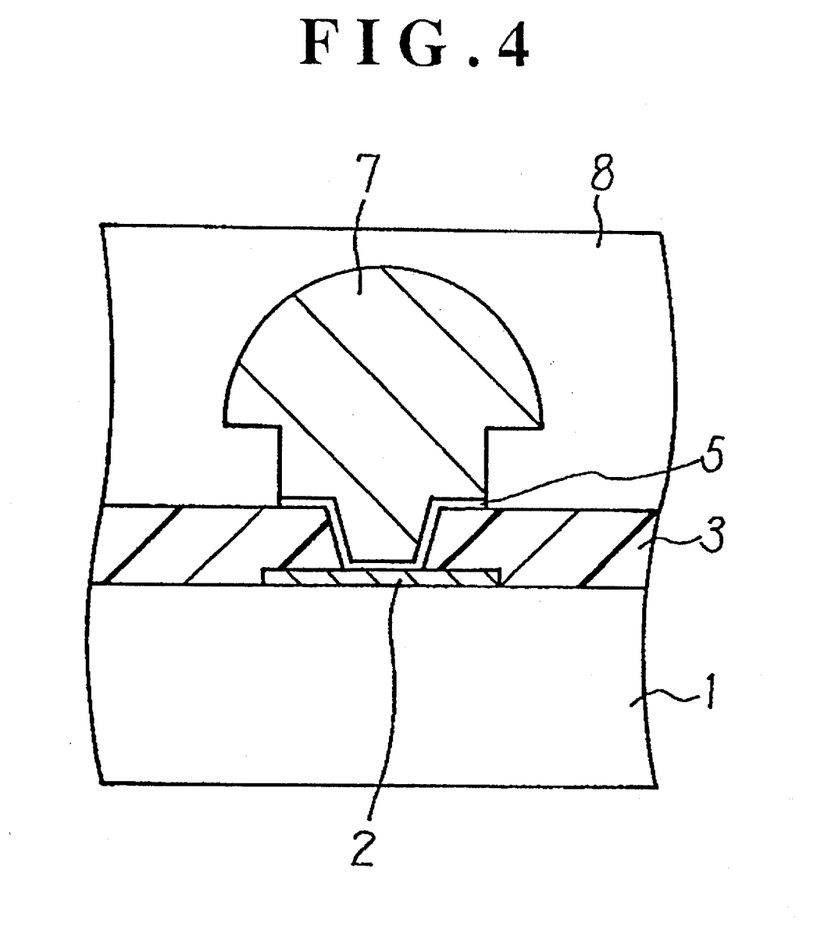
FIG. 4 is a fragmentary cross sectional elevation view illustrative of a novel sealing structure for bumps on a semiconductor integrated circuit chip to be bonded through the bumps onto a circuit board in a first embodiment according to the present invention.

In the next step, as illustrated in FIG. 4, the photoresist film 6 is removed. Subsequently, the metal film 5 is selectively removed by means of wet-etching using the bump 7 as a mask to remain in the each opening 4 and in the vicinity thereof. A sealing film 8 having a coefficient of viscosity in the range from 1000 cP to 2000 cP is provided to coat at least a surface of the bump 7 and the exposed surface of the organic insulation film 3. The sealing film 8 may comprise, a gelatinous silicone (for example, JCR 6110 or SE 1880). The sealing film 8 is in the form of a planarised film which covers an entire surface of the chip 1 to embed the bumps 7.

Figure 5:
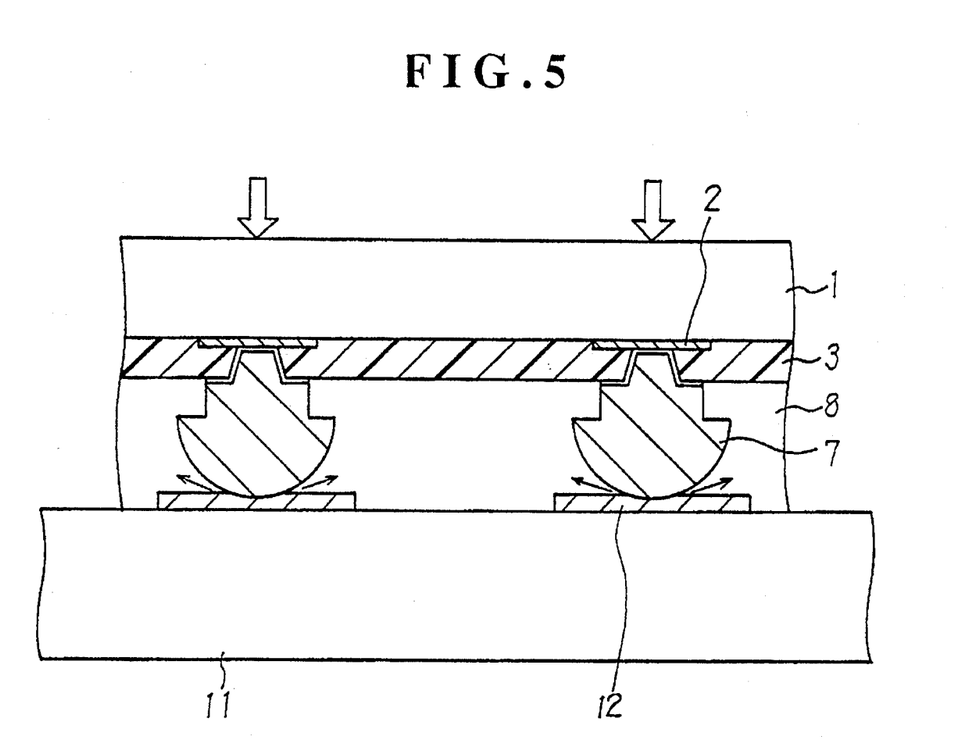
FIG. 5 is a fragmentary cross sectional elevation view illustrative of a semiconductor integrated circuit chip with an improved sealing structure for bumps when bonding the chip through the bumps onto a circuit board in a first embodiment according to the present invention.

FIG. 5 is illustrative of a process for bonding the chip 1 onto a circuit board 11. The above chip 1 is pressed down and the gelatinous silicone sealing film 8 is pressed by the circuit board 11 thereby the gelatinous silicone sealing film 8 is so deformed as to have the each bump 7 to be exposed and made contact with each of a plurality of pad 12 having already provided on the circuit board 11 wherein the sealing film 8 has a hardness sufficiently small for showing a deformation when bonding the chip 1.

The above gelatinous silicone sealing film 8 permits the chip 1 to be completely free from the problem that the bumps 7 and the chip 1 are contaminated or oxidized by an atmosphere. This may be capable of ensuring that the bumps 7 provide electrical contacts between the pads on the chip 1 and on the circuit board 11 to thereby keep a high yield in manufacturing of the products and make a reliability of both products.

A second embodiment according to the present invention will be described with reference to FIGS. 6 and 7 in which a novel sealing structure for bumps on pads formed on a semiconductor integrated circuit chip to be subsequently bonded through the bumps onto a circuit board.

Figure 6:
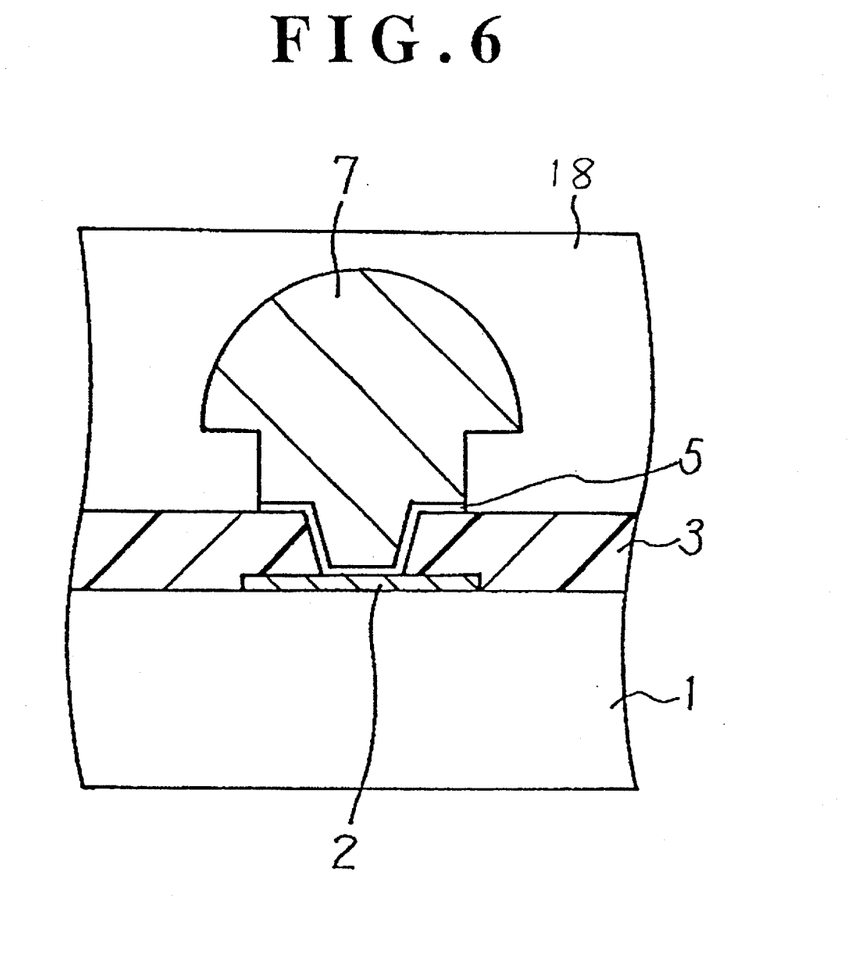
FIG. 6 is a fragmentary cross sectional elevation view illustrative of a novel sealing structure for bumps on a semiconductor integrated circuit chip to be bonded through the bumps onto a circuit board in a second embodiment according to the present invention.

A structure of a semiconductor integrated circuit chip 1 in a second embodiment according to the present invention to be bonded through bumps 7 onto a circuit board 11 is as illustrated in FIG. 6. The chip 1 is formed thereon with a plurality of pads 2. An organic insulation film 3 having a plurality of openings is formed on an entire surface of the chip 1. Each of the openings is positioned just over each of the pads 2 to allow at least a part of each pad 2 to be exposed through each of the openings. A plurality of metal films 5 are so formed that each is selectively formed on an exposed part of the each pad 2 and on a side wall of the each opening as well as on a top surface of the organic insulation film 3 but only in the vicinity of the each opening. A plurality of bumps 7 are formed just on the metal films 5 so as to be electrically connected through the metal films 5 to the pads 2. A sealing film 18 is provided to coat at least a surface of the bump 7 and the exposed surface of the organic insulation film 3. The sealing film 18 may comprise a micro-capsule material. The sealing film 18 is in the form of a planarised film which covers an entire surface of the chip 1 to embed the bumps 7. Since the micro-capsule sealing film 18 comprises micro-capsules deposited on the surface of the chip 1, the micro-capsule sealing film 18 is readily deformed by pressing due to collapses of the deposition of the micro-capsules and with crushing of the individual micro-capsules.

Figure 7:
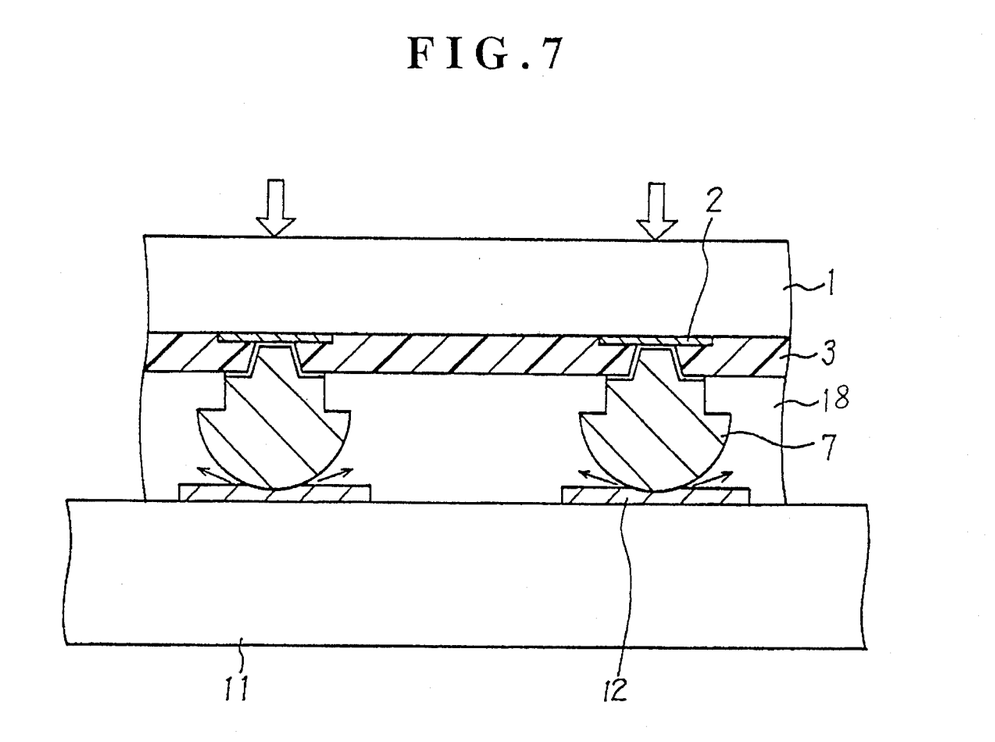
FIG. 7 is a fragmentary cross sectional elevation view illustrative of a semiconductor integrated circuit chip with an improved sealing structure for bumps when bonding the chip through the bumps onto a circuit board in a second embodiment according to the present invention.

FIG. 7 illustrates the chip 1 coated with the micro-capsule sealing film 18 when bonded onto a circuit board 1. In the bonding process, the above chip 1 is pressed down and the micro-capsule sealing film 18 is pressed by a plurality of pads 12 formed on the circuit board 11 thereby the micro-capsules constituting the sealing film 18 are crushed and the deposition structure of the micro-capsules is collapsed. As a result, the micro-capsule sealing film 18 is so deformed as to have the each bump 7 to be exposed and made contact with each of the pads 12 provided on the circuit board 11 wherein the sealing film 18 has a hardness sufficiently small for showing a deformation when bonding the chip 1, for example a hardness substantially corresponding to a coefficient of viscosity in the range front 1000 cP to 2000 cP.

The above micro-capsule sealing film 18 permits the chip 1 to be completely free from the problem that the bumps 7 and the chip 1 are contaminated or oxidized by an atmosphere. This may be capable of ensuring that the bumps 7 provide electrical contacts between the pads on the chip 1 and on the circuit board 11 to thereby keep a high yield in manufacturing of the products and make a reliability of both products.

A third embodiment according to the present invention will be described with reference to FIGS. 8 and 9 in which a novel sealing structure for bumps on pads formed on a semiconductor integrated circuit chip to be subsequently bonded through the bumps onto a circuit board.

Figure 8:
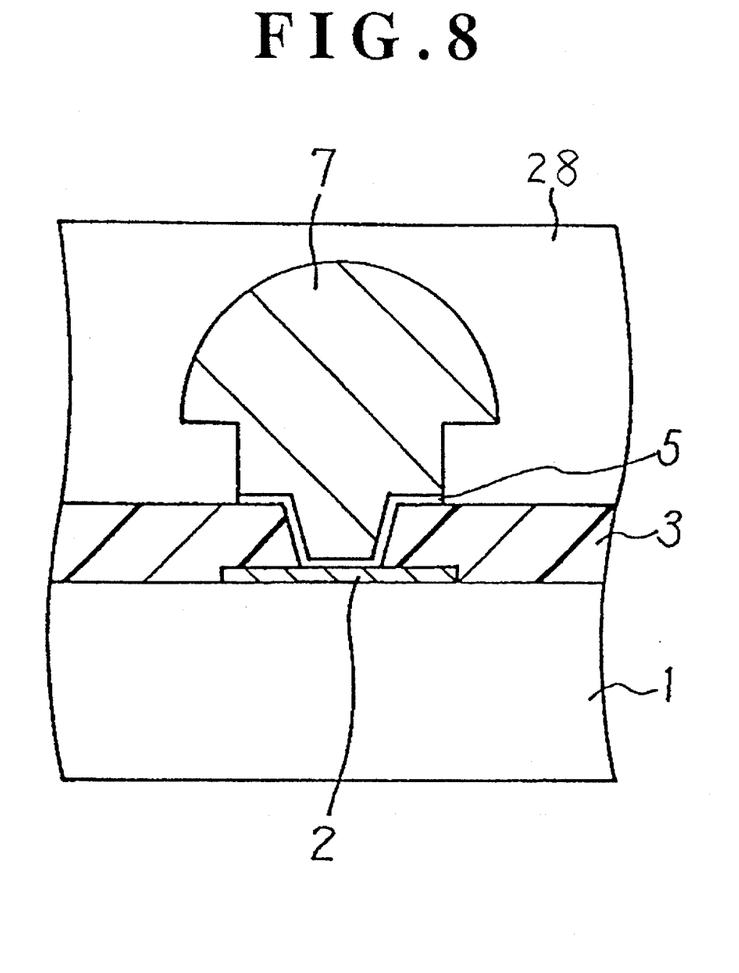
FIG. 8 is a fragmentary cross sectional elevation view illustrative of a novel sealing structure for bumps on a semiconductor integrated circuit chip to be bonded through the bumps onto a circuit board in a third embodiment according to the present invention.

A structure of a semiconductor integrated circuit chip 1 in a third embodiment according to the present invention to be bonded through bumps 7 onto a circuit board 11 is as illustrated in FIG. 8. The chip 1 is formed thereon with a plurality of pads 2. An organic insulation film 3 having a plurality of openings is formed on an entire surface of the chip 1. Each of the openings is positioned just over each of the pads 2 to allow at least a part of each pad 2 to be exposed through each of the openings. A plurality of metal films 5 are so formed that each is selectively formed on an exposed part of the each pad 2 and on a side wall of the each opening as well as on a top surface of the organic insulation film 3 but only in the vicinity of the each opening. A plurality of bumps 7 are formed just on the metal films 5 so as to be electrically connected through the metal films 5 to the pads 2. A sealing film 28 is provided to coat at least a surface of the bump 7 and the exposed surface of the organic insulation film 3. The sealing film 28 may comprise a creamy material having a coefficient of the viscosity in the range from 1000 cP to 2000 cP. The creamy material may, for example, comprise an epoxy resin dissolved in a solvent of alcohol systems adjusted to have a viscosity coefficient in the range of from 1000 cP to 2000 cP. The sealing film 28 is in the form of a planarised film which covers an entire surface of the chip 1 to embed the bumps 7.

Figure 9:
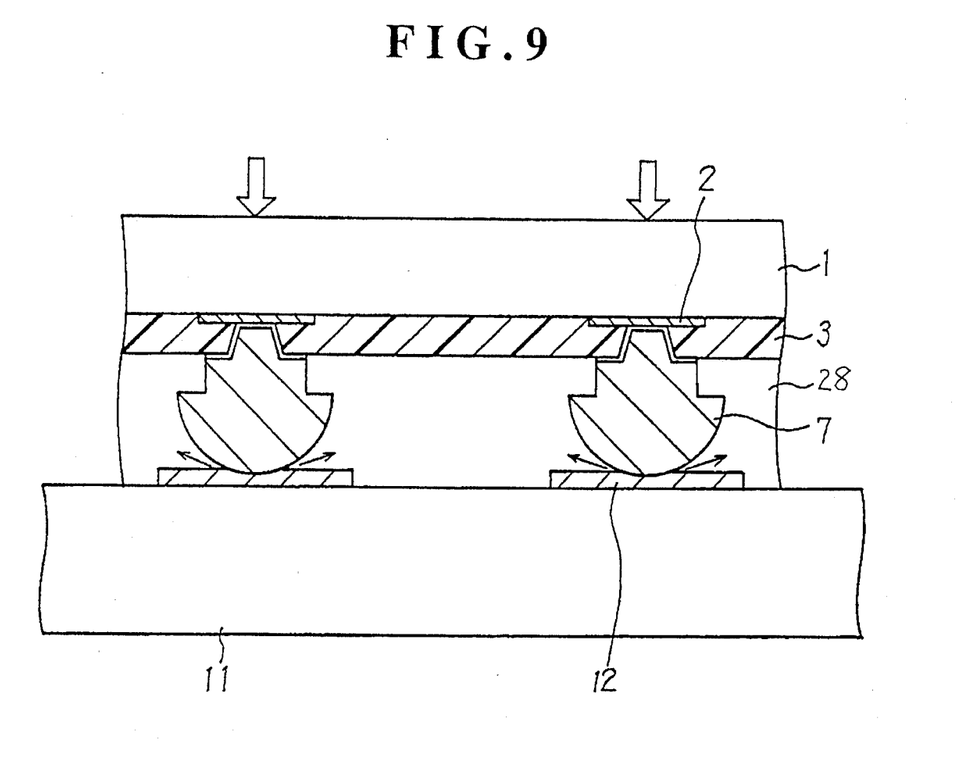
FIG. 9 is a fragmentary cross sectional elevation view illustrative of a semiconductor integrated circuit chip with an improved sealing structure for bumps when bonding the chip through the bumps onto a circuit board in a third embodiment according to the present invention.

FIG. 9 illustrates the chip 1 coated with the creamy sealing film 28 when bonded onto a circuit board 1. In the bonding process, the above chip 1 is pressed down and the creamy sealing film 28 is pressed by a plurality of pads, 12 formed on the circuit board 11 thereby the creamy sealing film 28 is so deformed as to have the each bump 7 to be exposed and made contact with each of the pads 12 provided on the circuit board 11.

The above creamy sealing film 28 permits the chip 1 to be completely free from the problem that the bumps 7 and the chip 1 are contaminated or oxidized by an atmosphere. This may be capable of ensuring that the bumps 7 provide electrical contacts between the pads on the chip 1 and on the circuit board 11 to thereby keep a high yield in manufacturing of the products and make a reliability of both products.

A fourth embodiment according to the present invention will be described with reference to FIGS. 10 and 11 in which a novel sealing structure for bumps on pads formed on a semiconductor integrated circuit chip to be subsequently bonded through the bumps onto a circuit board.

Figure 10:
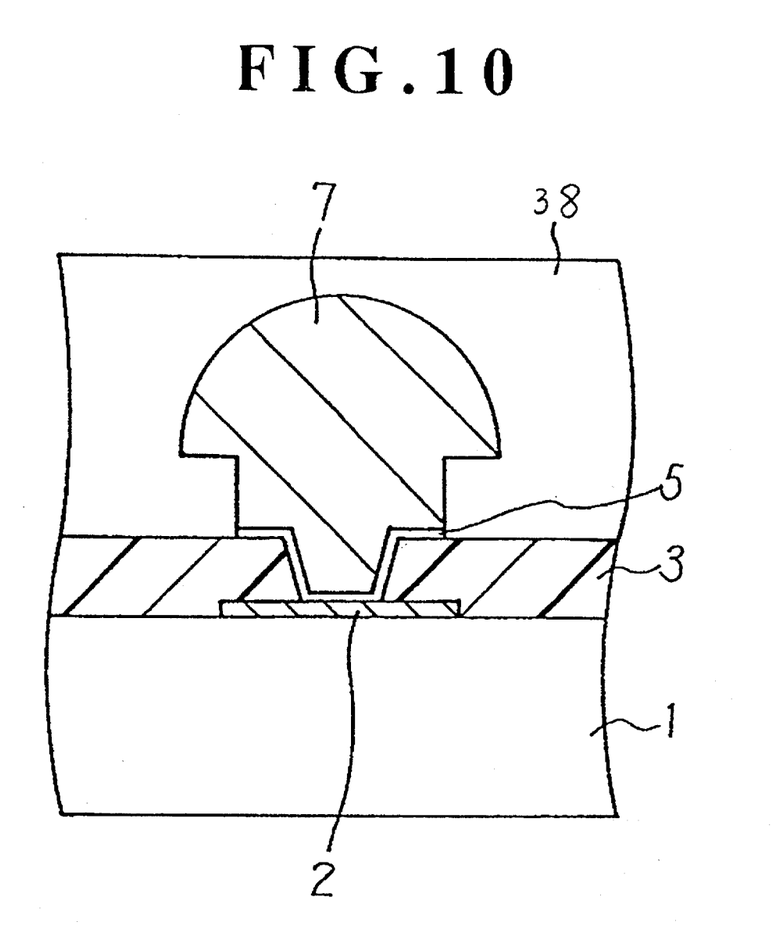
FIG. 10 is a fragmentary cross sectional elevation view illustrative of a novel sealing structure for bumps on a semiconductor integrated ,circuit chip to be bonded through the bumps onto a circuit board in a fourth embodiment according to the present invention.

A structure of a semiconductor integrated circuit chip 1 in a fourth embodiment according to the present invention to be bonded through bumps 7 onto a circuit board 11 is as illustrated in FIG. 10. The chip 1 is formed thereon with a plurality of pads 2. An organic insulation film 3 having a plurality of openings is formed on an entire surface of the chip 1. Each of the openings is positioned just over each of the pads 2 to allow at least a part of each pad 2 to be exposed through each of the openings. A plurality of metal films 5 are so formed that each is selectively formed on an exposed part of the each pad 2 and on a side wall of the each opening as well as on a top surface of the organic insulation film 3 but only in the vicinity of the each opening. A plurality of bumps 7 are formed just on the metal films 5 so as to be electrically connected through the metal films 5 to the pads 2. A sealing film 38 is provided to coat at least a surface of the bump 7 and the exposed surface of the organic insulation film 3. The sealing film 38 may comprise a thermoplastic resin material showing a small coefficient of the viscosity in the range from 1000 cP to 2000 cP but becomes hard when the thermoplastic resin material is cured. The thermoplastic resin material may, for example, comprise a phenol resin adjusted to have a viscosity coefficient in the range of from 1000 cP to 2000 cP. The sealing film 38 is in the form of a planarised film which covers an entire surface of the chip 1 to embed the bumps 7.

Figure 11:
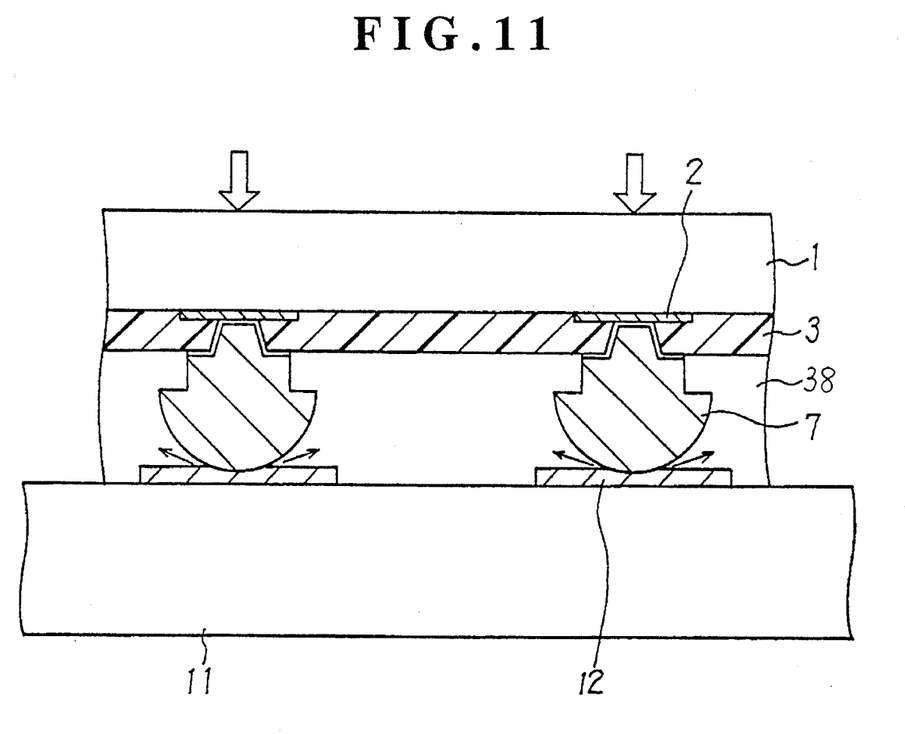
FIG. 11 is a fragmentary cross sectional elevation view illustrative of a semiconductor integrated circuit chip with an improved sealing structure for bumps when bonding the chip through the bumps onto a circuit board in a fourth embodiment according to the present invention.

FIG. 11 illustrates the chip 1 coated with the thermoplastic resin sealing film 38 when bonded onto a circuit board 1. In the bonding process, the above chip 1 is pressed down and the thermoplastic resin sealing film 38 is pressed by a plurality of pads 12 formed on the circuit board 11 thereby the thermoplastic resin sealing film 38 is so deformed as to have the each bump 7 to be exposed and made contact with each of the pads 12 provided on the circuit board 11. After the chip 1 was bonded to the circuit board through the bumps 7, the thermoplastic resin sealing film 38 such as a phenol resin film is cured to thereby become hard. The cured thermoplastic resin sealing film 38 having a larger hardness than that of the uncured thermoplastic resin sealing film may securely support the bonding between the chip 1 and the circuit board 11.

The above thermoplastic resin sealing film 38 permits the chip 1 to be completely free from the problem that the bumps 7 and the chip 1 are contaminated or oxidized by an atmosphere. This may be capable of ensuring that the bumps 7 provide electrical contacts between the pads on the chip 1 and on the circuit board 11 to thereby keep a high yield in manufacturing of the products and make a reliability of both products.

A fifth embodiment according to the present invention will be described with reference to FIGS. 12A and 12B, 13 and 14 in which a novel sealing structure for bumps on pads formed on a semiconductor integrated circuit chip to be subsequently bonded through the bumps onto a circuit board.

Figure 12A:
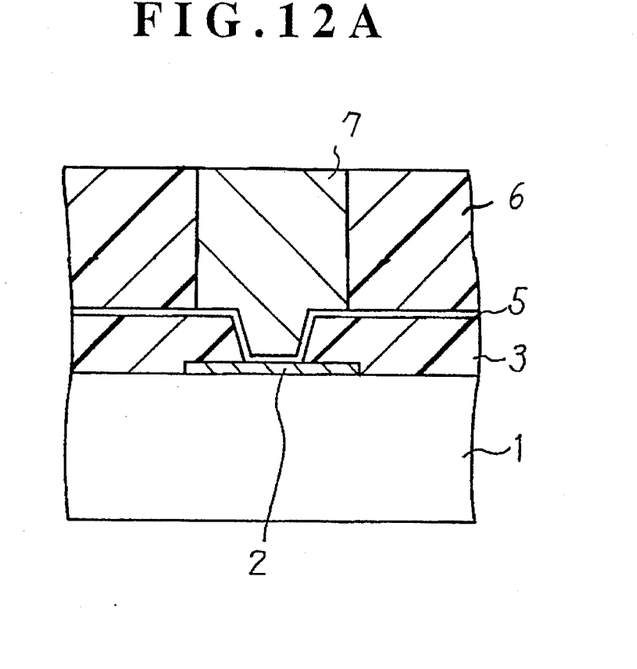
FIGS. 12A and 12B are fragmentary cross sectional elevation views illustrative of sequential processes for forming bumps on a semiconductor integrated circuit chip in a fifth embodiment according to the present invention.
Figure 12B:
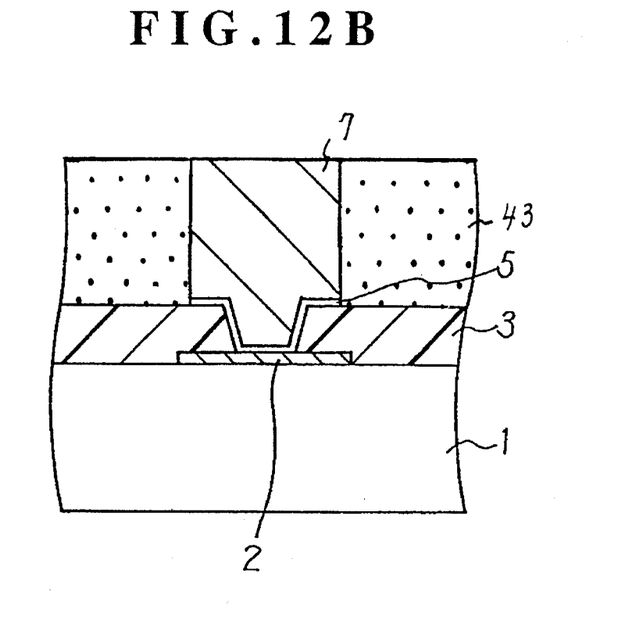

An initial description of the fifth embodiment will be directed to a process for forming bumps on pads formed on a semiconductor integrated circuit chip 1 with reference to FIGS. 12A and 12B. A plurality of pads 2 are formed on a chip 1. An organic insulation film 3 is formed on an entire surface of the chip 1 to cover the pads 2. The organic insulation film 3 is selectively removed by etching to form a plurality of openings 4. Each of the openings 4 is positioned just over each correspondent of the pads 2 to allow at least a part of each pad 2 to be exposed through the each opening 4. A metal film 5 is formed on an exposed part of the surface of the each pad 2 and on a side wall of the each opening 4 as well as on a top of the organic insulation film 3.

In the next step, a photoresist film 6 having a larger thickness than a height of bumps to be formed hereafter is deposited on the metal film 5. The deposited photoresist film 6 is patterned by means of a lithography technique to form windows positioned just over the openings 4 wherein the windows have a larger size than that of the openings 4 so that the metal film 5 in the opening 4 and in the vicinity thereof is exposed through the each window of the photoresist film 6. A Pb-Sn solder film is selectively plated just on the exposed part to deposit within the windows thereby bumps 7 having a column-like shape defined by the definition of the windows are formed within the windows. The bumps 7 are electrically connected through the metal film 5 to the pads 2 on the chip 1.

In the next step, as illustrated in FIG. 12B, the photoresist film 6 is removed and the metal film 5 is selectively removed by means of wet-etching using the bump 7 as a mask to remain in the each opening 4 and in the vicinity thereof so that the organic insulation film 3 is exposed except for a part thereof under the each bump 7. An insulation film 43 is subsequently formed on the organic insulation film 3 except on a top of each of the bumps 7. The insulation film 43 has a thickness so adjusted that a top of the insulation film 43 has almost the same level as a top of the bump 7.

Figure 13:
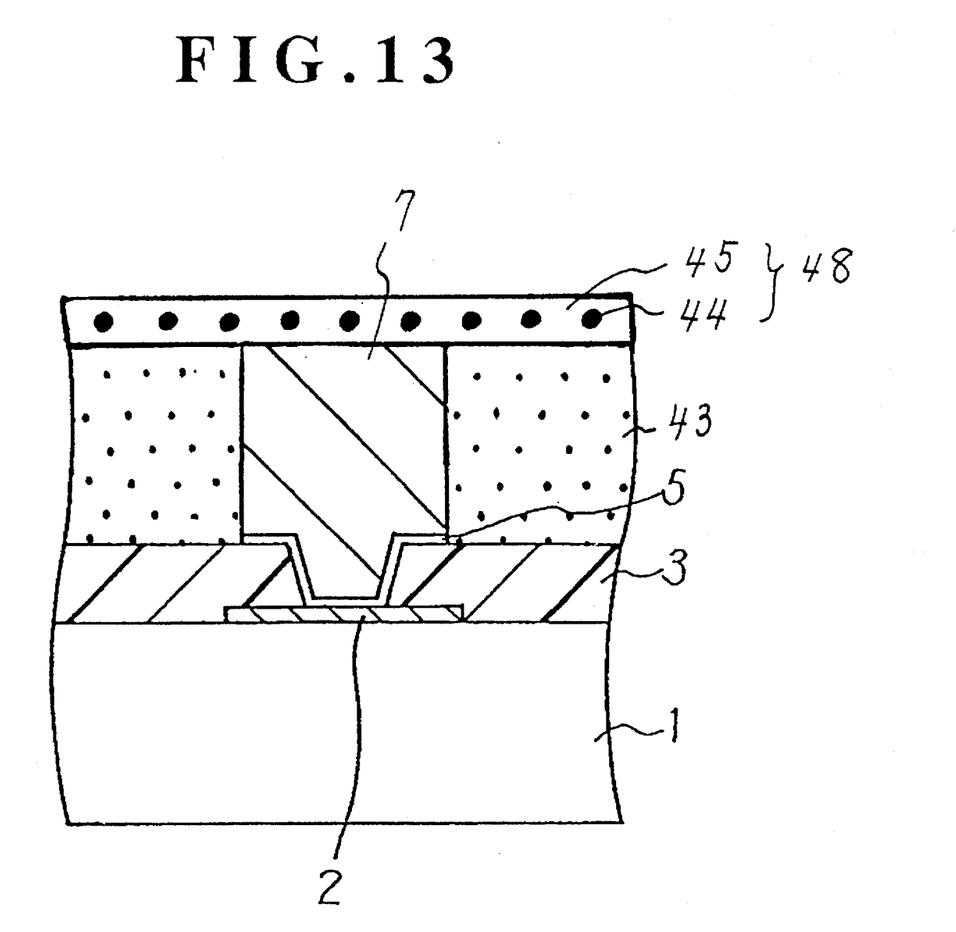
FIG. 13 is a fragmentary cross sectional elevation view illustrative of a novel sealing structure for bumps on a semiconductor integrated circuit chip to be bonded through the bumps onto a circuit board in a fifth embodiment according to the present invention.

As illustrated in FIG. 13, an anisotropic conductive film 48 is provided on an entire surface of the chip to coat a top portion of the each bump 7 and on the insulation film 43. The anisotropic conductive film 48 is adjusted to permit an electrical current but only in a vertical direction or a thickness direction and then prevent any electrical current in a horizontal direction. The anisotropic conductive film 48 may, for example, comprise an insulating sheet 45 including a two-dimensional array of conductive particles therein or a two-dimensional array of conductive column materials therein. Each of the conductive particles may comprise soft resin particles covered with gold films or metal particles such as Ni. The insulating sheet 45 of the anisotropic conductive film 48 has a sufficiently small hardness for allowing the insulating sheet to show a deformation or a depression by pressing with pads in a bonding process, for example, adjusted has a coefficient of viscosity in the range from 1000 cP to 2000 cP.

Figure 14:
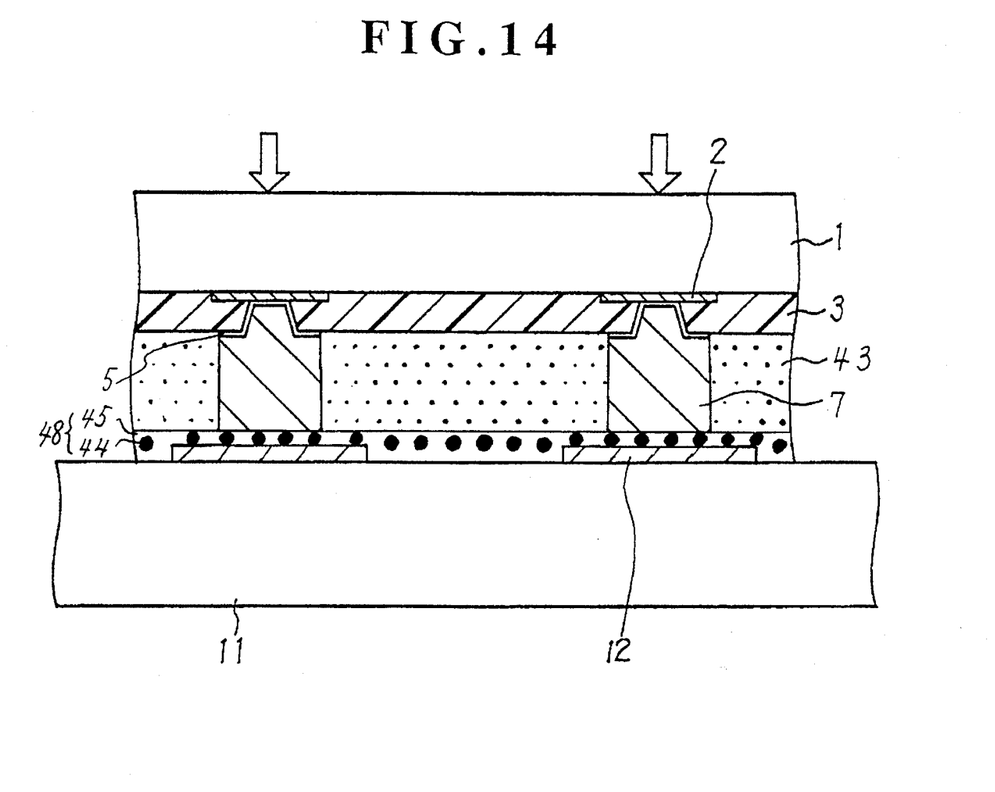
FIG. 14 is a fragmentary cross sectional elevation view illustrative of a semiconductor integrated circuit chip with an improved sealing structure for bumps when bonding the chip through the bumps onto a circuit board in a fifth embodiment according to the present invention.

FIG. 14 illustrates the chip 1 coated with the anisotropic conductive film 48 when bonded onto a circuit board 1. In the bonding process, the above chip 1 is pressed down and the anisotropic conductive film 48 is pressed by a plurality of pads 12 formed on the circuit board 11 thereby the insulating sheet 45 is so depressed or deformed as to make the each conductive particles 44 contact with the both pads 2 and 12.

The above anisotropic conductive film 48 and the insulation film 43 permit the chip 1 to be completely free from the problem that the bumps 7 and the chip 1 are contaminated or oxidized by an atmosphere. This may be capable of ensuring that the bumps 7 provide electrical contacts between the pads on the chip 1 and on the circuit board 11 to thereby keep a high yield in manufacturing of the products and make a reliability of both products.

Whereas modifications of the present invention will be apparent to a person having ordinary skill in the art, to which the invention pertains, it is to be understood that embodiments shown and described by way of illustrations are by no means intended to be considered in a limiting sense. Accordingly, it is to be intended to cover by claims any modifications which fall within the spirit and scope of the present invention.

What is claimed is:

1. A semiconductor integrated circuit chip to be bonded through bumps onto a circuit board, said chip having:
   a plurality of pads formed on said semiconductor integrated circuit chip, each of said pads being formed with a bump thereon; and
   a coating material being provided to coat at least surfaces of said a plurality of bumps, said material being made of an insulation material having a hardness sufficiently small for showing, when bonding said chip onto said circuit board, a deformation thereby at least a top portion of each of said bumps contacts pads provided on said circuit board.

2. The chip as claimed in claim 1, wherein said coating material comprises a gelatinous material having a coefficient of viscosity in the range from 1000 cP to 2000 cP.

3. The chip as claimed in claim 2, wherein said gelatinous material comprises a film within which said a plurality of bumps are embedded, said film being formed on an entire surface of said chip.

4. The chip as claimed in claim 3, wherein said gelatinous material comprises a silicone.

5. The chip as claimed in claim 1, wherein said coating material comprises a micro-capsule material.

6. The chip as claimed in claim 5, wherein said micro-capsule material comprises a film within which said a plurality of bumps are embedded, said film being formed on an entire surface of said chip.

7. The chip as claimed in claim 1, wherein said coating material comprises a creamy material having a coefficient of viscosity in the range from 1000 cP to 2000 cP.

8. The chip as claimed in claim 7, wherein said creamy material comprises a film within which said a plurality of bumps are embedded, said film being formed on an entire surface of said chip.

9. The chip as claimed in claim 8, wherein said creamy material comprises an epoxy resin dissolved in a solvent of alcohol systems.

10. The chip as claimed in claim 1, wherein said coating material comprises a thermoplastic resin which shows a coefficient of viscosity in the range from 1000 cP to 2000 cP except when said thermoplastic resin is cured.

11. The chip as claimed in claim 10, wherein said thermoplastic resin is in the form of a film within which said a plurality of bumps are embedded, said film being formed on an entire surface of said chip.

12. The chip as claimed in claim 10, wherein said thermoplastic resin is a resin of phenol systems.

13. A semiconductor integrated circuit chip to be bonded through bumps onto a circuit board, said chip having:
   a plurality of pads formed on said semiconductor integrated circuit chip, each of said pads being formed with a bump thereon; and
   an anisotropic conductive film being provided on said bumps so that said bumps provide contact through said anisotropic conductive film to pads of said circuit board, said anisotropic conductive film allowing a current in a direction vertical to a surface of said anisotropic conductive film but preventing any current along said surface of said anisotropic conductive film thereby said each bump is electrically conductive through said anisotropic conductive film to the corresponding pad on said circuit board but there is no conductivity among said pads as well as among said pads on said circuit board.

14. The semiconductor integrated circuit chip as claimed in claim 13, wherein said anisotropic conductive film comprises an insulation sheet including a two-dimensional array of conductive particles therein, said insulation sheet having a sufficiently small hardness for allowing said insulating sheet to show a deformation when bonding said chip onto said circuit board thereby said conductive particles are made contact with both said pads formed on said chip and on said circuit board.

15. The semiconductor integrated circuit chip as claimed in claim 13, wherein said anisotropic conductive film comprises an insulation sheet including a two-dimensional array of column-shaped conductive materials exposed on opposite surfaces of the insulation sheet so that when bonding said chip onto said circuit board, then said column-shaped conductive materials provide contact with both said pads formed on said chip and on said circuit board.

16. A semiconductor integrated circuit chip to be bonded through bumps onto a circuit board, said chip having:
   a plurality of pads formed on said semiconductor integrated circuit chip;
   a layer made of an organic insulation material and formed on an entire surface of said chip, said organic insulation layer having a plurality of openings, each of said openings being positioned just over each of said pads to allow at least a part of said each pad to be exposed through each of said openings;
   a plurality of metal films, each of said metal films being selectively formed on an exposed part of said surface of said each pad and on a side, wall of said each opening as well as on a top surface of said organic insulation film in the vicinity of said each opening;
   a plurality of bumps formed just on said metal films so as to be electrically connected through said metal films to said pads; and
   a coating material being provided to coat at least surfaces of said a plurality of bumps, said material being made of an insulation material having a hardness sufficiently small for showing, when bonding said chip onto said circuit board, a deformation thereby at least a top portion of each of said bumps contacts pads provided on said circuit board.

17. The chip as claimed in claim 16, wherein said coating material comprises a gelatinous material having a coefficient of viscosity in the range from 1000 cP to 2000 cP.

18. The chip as claimed in claim 17, wherein said gelatinous material comprises a film within which said a plurality of bumps are embedded, said film being formed on an entire surface of said chip.

19. The chip as claimed in claim 18, wherein said gelatinous material comprises a silicone.

20. The chip as claimed in claim 16, wherein said coating material comprises a micro-capsule material.

21. The chip as claimed in claim 20, wherein said micro-capsule material comprises a film within which said a plurality of bumps are embedded, said film being formed on an entire surface of said chip.

22. The chip as claimed in claim 16, wherein said coating material comprises a creamy material having a coefficient of viscosity in the range from 1000 cP to 2000 cP.

23. The chip as claimed in claim 22, wherein said creamy material comprises a film within which said a plurality of bumps are embedded, said film being formed on an entire surface of said chip.

24. The chip as claimed in claim 22, wherein said creamy material comprises an epoxy resin dissolved in an alcohol system solvent.

25. The chip as claimed in claim 16, wherein said coating material comprises a thermoplastic resin which shows a coefficient of viscosity in the range from 1000 cP to 2000 cP except when said thermoplastic resin is cured.

26. The chip as claimed in claim 25, wherein said thermoplastic resin is in the form of a film within which said a plurality of bumps are embedded, said film being formed on an entire surface of said chip.

27. The chip as claimed in claim 25, wherein said thermoplastic resin is a resin of phenol systems.

28. A semiconductor integrated circuit chip to be bonded through bumps onto a circuit board, said chip having:
- a plurality of pads formed on said semiconductor integrated circuit chip;
- a layer made of an organic insulation material and formed on an entire surface of said chip, said organic insulation layer having a plurality of openings, each of said openings being positioned just over each of said pads to allow at least a part of said each pad to be exposed through each of said openings;
- a plurality of metal films, each of said metal films being selectively formed on an exposed part of said surface of said each pad and on a side wall of said each opening as well as on a top surface of said organic insulation film in the vicinity of said each opening;
- a plurality of bumps selectively formed just on said metal films so as to be electrically connected through said metal films to said pads, each of said bumps having a flat top;
- an insulation film formed on said organic insulation film except on said flat top of said bump, said insulation film having a thickness so adjusted that a top of the insulation film has almost the same level as said flat top of said bump; and
- an anisotropic conductive film being provided on said a plurality of bumps so that said bumps provide contact through said anisotropic conductive film to pads of said circuit board, said anisotropic conductive film allowing a current in a direction vertical to a surface of said anisotropic conductive film but preventing any current along said surface of said anisotropic conductive film thereby said each bump is electrically conductive through said anisotropic conductive film to the, corresponding pad on said circuit board but there is no conductivity among said bumps as well as among said pads on said circuit board.

29. The semiconductor integrated circuit chip as claimed in claim 28, wherein said anisotropic conductive film comprises an insulation sheet including a two-dimensional array of conductive particles therein, said insulation sheet having a sufficiently small hardness for allowing said insulating sheet to show a deformation when bonding said chip onto said circuit board thereby said conductive particles are made contact with both said pads formed on said chip and on said circuit board.

30. The semiconductor integrated circuit chip as claimed in claim 28, wherein said anisotropic conductive film comprises an insulation sheet including a two-dimensional array of column-shaped conductive materials exposed on opposite surfaces of the insulation sheet so that when bonding said chip onto said circuit board, then said column-shaped conductive materials are made contact with both said pads formed on said chip and on said circuit board.

* * * * *